United States Patent
Choi et al.

(10) Patent No.: US 9,826,629 B2
(45) Date of Patent: Nov. 21, 2017

(54) ELECTRONIC DEVICE INCLUDING WIRING ON A STRETCHABLE/CONTRACTIBLE BASE

(71) Applicant: Samsung Display Co., Ltd., Yongin (KR)

(72) Inventors: Won Il Choi, Ansan-si (KR); Jong Ho Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/729,806

(22) Filed: Jun. 3, 2015

(65) Prior Publication Data

US 2016/0219696 A1 Jul. 28, 2016

(30) Foreign Application Priority Data

Jan. 28, 2015 (KR) .................. 10-2015-0013215

(51) Int. Cl.
*H05K 1/00* (2006.01)
*H05K 1/02* (2006.01)

(52) U.S. Cl.
CPC ... *H05K 1/0283* (2013.01); *H05K 2201/0311* (2013.01); *H05K 2201/0323* (2013.01); *H05K 2201/0329* (2013.01); *H05K 2201/0373* (2013.01); *H05K 2201/0391* (2013.01); *H05K 2201/09263* (2013.01); *H05K 2201/09272* (2013.01); *H05K 2201/09736* (2013.01)

(58) Field of Classification Search
CPC ......... H05K 1/0283; H05K 2201/0311; H05K 2201/0323; H05K 2201/0329; H05K 2201/0373

USPC .................. 174/254, 250, 251, 255–258, 261
See application file for complete search history.

(56) References Cited

U.S. PATENT DOCUMENTS

| | | | |
|---|---|---|---|
| 8,018,563 B2 | 9/2011 | Jones et al. | |
| 2006/0124347 A1* | 6/2006 | Takaike | H01L 25/0657 174/254 |
| 2006/0163743 A1* | 7/2006 | Kuwabara | H01L 21/288 257/773 |
| 2007/0297157 A1* | 12/2007 | Tanaka | H01L 23/49822 361/766 |
| 2010/0002402 A1 | 1/2010 | Rogers et al. | |
| 2010/0330338 A1 | 12/2010 | Boyce et al. | |

(Continued)

FOREIGN PATENT DOCUMENTS

| | | |
|---|---|---|
| KR | 10-2009-0086199 | 8/2009 |
| KR | 10-2010-0017128 | 2/2010 |

(Continued)

*Primary Examiner* — Tremesha S Willis
(74) *Attorney, Agent, or Firm* — H.C. Park & Associates, PLC

(57) ABSTRACT

An electronic device including a stretchable/contractible base and a wiring formed on the base, the wiring being divided into a first region having a shape extending in a proceeding direction and a second region in which the proceeding direction is curved. The wiring includes a first conductive layer and a second conductive layer formed of a material that makes the second conductive layer easier to be curved than the first conductive layer. The first conductive layer is formed in the first region and the second conductive layer is formed in the second region.

17 Claims, 9 Drawing Sheets

(56) References Cited

U.S. PATENT DOCUMENTS

2011/0232945 A1* 9/2011 Whitcomb ............ C03C 17/007
                                                    174/254
2012/0251824 A1   10/2012 Hur et al.
2012/0279762 A1   11/2012 Hur et al.
2014/0182920 A1*  7/2014 Yanagisawa ......... H05K 3/0035
                                                    174/266

FOREIGN PATENT DOCUMENTS

| KR | 10-2012-0111661 | 10/2012 |
| KR | 10-2012-0124346 | 11/2012 |
| WO | 2008030960 | 3/2008 |

* cited by examiner

ELECTRONIC DEVICE INCLUDING WIRING ON A STRETCHABLE/CONTRACTIBLE BASE

CROSS-REFERENCE TO RELATED APPLICATION

This application claims priority from and the benefit of Korean Patent Application No. 10-2015-0013215, filed on Jan. 28, 2015, which is hereby incorporated by reference for all purposes as if fully set forth herein.

BACKGROUND

Field

Exemplary embodiments relate to an electronic device, and more particularly, to a stretchable electronic device.

Discussion of the Background

Electronic devices are currently being used in various fields, and are experiencing a gradually widening range of their various applications. Recently, demand has been increasing for stretchable and flexible electronic devices. Typical examples of such electronic devices include a flexible display, a wearable display, a smart cloth, a bio sensor, etc.

To make electronic devices stretchable, the base members of the electronic devices are required to be stretchable, and the wirings or electrodes formed on the base members are required to maintain electrical characteristics thereof according to the stretchable properties of the base members.

Materials such as metal have excellent conductivity for use as wirings or electrodes. However, because of lack of flexibility, such materials are not easily stretched. As alternative materials, carbon nanotubes, conductive polymers, and the like are being taken into consideration, but such alternative materials may not easily offer sufficient conductivity.

Furthermore, methods for enabling electronic devices to have stretchable properties by changing the structural configurations of wirings have also been considered. However, cracks or the like may occur in the electronic devices in cases where stresses are accumulated by repeated stretching.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide electronic devices including stretchable wirings.

Additional aspects will be set forth in the detailed description which follows, and, in part, will be apparent from the disclosure, or may be learned by practice of the inventive concept.

An exemplary embodiment of the present invention discloses an electronic device including: a stretchable/contractible base and a wiring formed on the base, the wiring being divided into a first region having a shape extending in a proceeding direction and a second region in which the proceeding direction is curved. The wiring includes a first conductive layer and a second conductive layer formed of a material that makes the second conductive layer easier to be curved than the first conductive layer. The first conductive layer is formed in the first region and the second conductive layer is formed in the second region.

An exemplary embodiment of the present invention also discloses an electronic device including a stretchable/contractible base and a wiring formed on the base, the wiring including a first conductive pattern and a second conductive pattern formed of a material that makes the second conductive pattern easier to be curved than the first conductive pattern. The first conductive pattern is divided into a first region having a shape extending in a proceeding direction and a second region in which the proceeding direction is curved. The second conductive pattern is formed into a line extending through the second regions of the first conductive pattern.

An exemplary embodiment of the present invention also discloses an electronic device including a stretchable/contractible base, a first conductive layer formed on the base, the first conductive layer having therein a first cut-out opening pattern extendable in a first direction and a second cut-out opening pattern extendable in a second direction, and a second conductive layer formed in the first cut-out opening pattern and the second cut-out opening pattern and electrically connected to the first conductive layer. The second conductive layer is formed of a material that makes the second conductive layer easier to be curved than the first conductive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
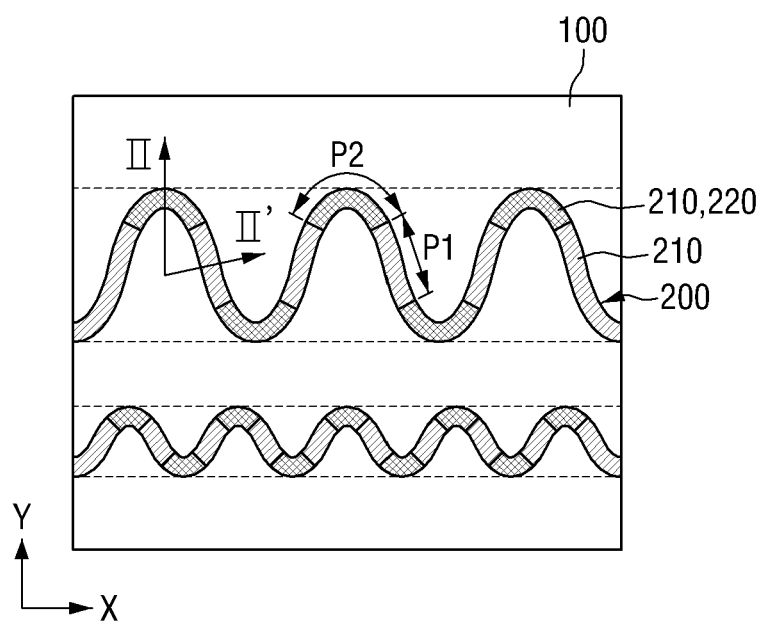
FIG. 1 is a plan view of an electronic device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

Figure 2:
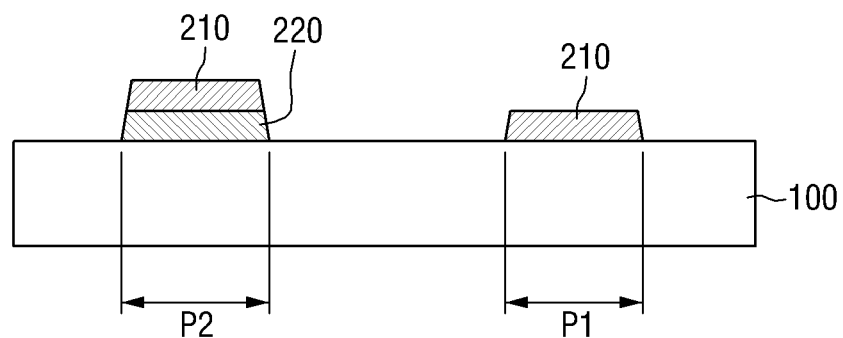
FIG. 2 is a cross-sectional view taken along the line II-II' of FIG. 1.
Figure 3:
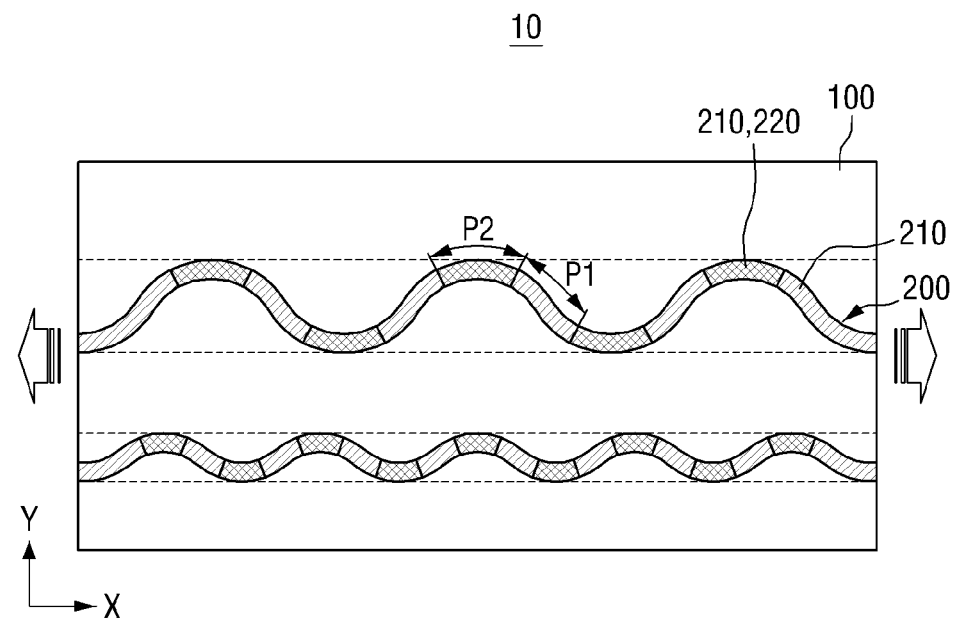
FIG. 3 and FIG. 4 are plan views illustrating stretched shapes of the electronic device of FIG. 1.
Figure 4:
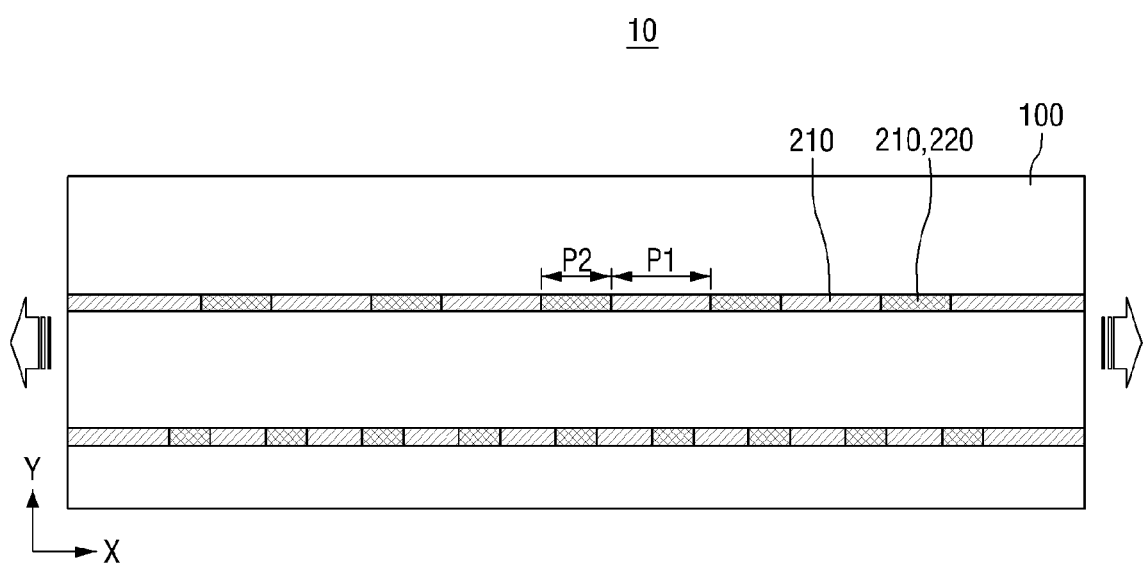

FIG. 1 is a plan view of an electronic device according to an exemplary embodiment of the present invention. FIG. 2 is a cross-sectional view taken along the line II-II' of FIG. 1. FIG. 3 and FIG. 4 are plan views illustrating stretched shapes of the electronic device of FIG. 1.

Referring to FIGS. 1 and 2, an electronic device 10 according to an exemplary embodiment of the present invention includes a base 100 and at least one wiring 200 provided on the base 100.

The base 100 may be formed of a stretchable/contractible material. In this case, the base 100 being formed to be "stretchable/contractible" means that the base 100 may be elongated or contracted in a specific direction. The material which forms the base 100 may have properties of returning to its original shape when external force is removed after being stretched or contracted. The base 100 may be formed of a material having high elastic force and high restoring force.

Furthermore, the material which forms the base 100 may have properties of being stretchable/contractible and being curved or bendable. The base 100 may return to its original shape when external force is removed after being curved or bent, if the base 100 has high restoring force.

To ensure that the base 100 has such properties, the base 100 may be formed of a stretchable/contractible polymer resin. Examples of the stretchable/contractible polymer resin may include polybutadiene, poly(styrene-butadiene), poly (styrene-butadiene-styrene), poly(styrene-ethylene-butylene-styrene), polyurethane, polyisoprene, or a combination thereof, however, the present invention is not limited thereto.

At least one wiring 200 is formed on the base 100. The wiring 200 may enable current to flow or electrical signals to be transmitted. The wiring 200 may serve as an electrode in whole or in part.

The wiring 200 may be formed directly on the base 100 or may be formed on the base 100 with an intermediate structure provided therebetween. In an exemplary embodiment, the wiring 200 may be arranged in extremely close contact with a lower structure arranged directly beneath the wiring 200 (for example, the base 100 or other intermediate structure). In this case, the wiring 200 being arranged in extremely close contact with the lower structure means that the wiring 200 is adhered to the lower structure rather than being popped up from the lower structure. In this case, no air layer is formed between the wiring 200 and the lower structure arranged directly beneath the wiring 200. However, the present invention is not limited thereto.

The structure arranged directly beneath the wiring 200 may be formed of a material having a greater resistance than that of the wiring 200, for example, an insulating material. In cases where the wiring 200 is formed directly on the base 100, the base 100 may be formed of an insulating material. However, in cases where an insulating layer is interposed between the wiring 200 and the base 100, the base 100 may be formed of an insulating material or a conductive or semi-conductive material. In this case, the insulating layer interposed between the wiring 200 and the base 100 may be formed of a stretchable/contractible material, or a material that can at least stretch/contract in response to the stretching/contraction of the base 100, or the insulating layer may be formed to have a thickness or shape that can at least stretch/contract in response to the stretching/contraction of the base 100.

The wiring 200 may have a curved or bent shape when viewed in a plan view before the base 100 is stretched. The wiring 200 may be divided into a first region P1 and a second region P2. The first region P1 of the wiring 200 may be an extension having a shape extending generally in a proceeding direction. The second region P2 of the wiring 200 may be a curved portion where the proceeding direction of the wiring 200 is curved, or a bent portion where the proceeding direction of the wiring 200 is bent.

In an exemplary embodiment, the curved portion of the second region P2 may be arranged with a regular repeating cycle. For example, the wiring 200 may have a sine curve shape. The wiring 200 may proceed in an oscillating manner, with constant amplitude and regular cycle. The wiring 200 may have a zigzag shaped outer appearance overall. Although the curved portion of the second region P2 is depicted as a curve in the drawing, the curved portion may have a bent shape in which a straight line is more sharply bent than the curved shape.

When the base 100 is stretched in a bilateral direction parallel to X-axis, the curved wiring 200 arranged on the base 100 is stretched in the stretching direction of the base 100, as shown in FIG. 3. As the base 100 is stretched, the distance between one end and the other end of the wiring 200 is lengthened, the amplitude of the wiring 200, which is the width of the wiring 200 in Y-axis direction, is reduced, and the cycle of repeating the curved portion of the wiring 200 is lengthened. As shown in FIG. 4, the base 100 can be stretched until the wiring 200 is completely stretched into a straight line. In the process of stretching the base 100 shown in FIGS. 1, 3, and 4, the width of the base 100 may increase and the width of the wiring 200 in X-axis direction may also increase when the curved parts of the wiring 200 are stretched, although the length of the wiring 200 itself is not lengthened.

When a plurality of wirings 200 are arranged on the base 100, wirings 200 different from each other may have different amplitudes and/or cycles. However, even in this case, the electronic device may be designed such that maximum widths of the wirings 200 to be stretched when the base 100 is stretched are the same.

When the base 100 is contracted in the direction parallel to X-axis, or when force for stretching the base 100 is removed by the restoring force of the base 100, thereby restoring the base 100 to its original state, the distance between one end and the other end of the wiring 200 is reduced, the amplitude of the wiring 200 increases, and the cycle of repeating the curved portion of the wiring 200 is reduced.

The wiring 200 may be stressed during the above-described process of being stretched and bent, and the curved portion of the wiring 200 may relatively be more stressed. When the wiring 200 is exposed to stress, the wiring 200 may be partially broken or disconnected, thus significantly increasing electrical resistance. To relieve such phenomenon, the curved portion of the wiring 200 has a construction different from those of other portions. Hereinafter, the construction of the wiring 200 will be explained in more detail with reference to FIGS. 1 and 2.

The wiring 200 includes a first conductive layer 210 and a second conductive layer 220. The second conductive layer 220 may be formed of a conductive material which can be relatively easily curved. The first conductive layer 210 may be formed of a conductive material which cannot be relatively easily curved as compared with the second conductive layer 220. For example, the first conductive layer 210 may be formed of a rigid conductive material, and the second conductive layer 220 may be formed of a flexible conductive material. Each of the first conductive layer 210 and/or the second conductive layer 220 may be a transparent conductive layer or an opaque conductive layer.

The first conductive layer 210 may be formed of metal or a metal oxide layer. For example, the first conductive layer 210 may be formed of copper, nickel, molybdenum, chrome, tungsten, aluminum, tin oxide ($SnO_2$), zinc oxide (ZnO), indium tin oxide (ITO), or an alloy thereof.

The second conductive layer 220 may be formed of carbon nanotube (CNT), graphene, metal nanowire (for example, Ag nanowire), metal nanoparticle, metal ribbon, conductive polymer and the like, or a mixture thereof. An example of conductive polymer may include poly(3-alkyl) thiophene (P3AT), poly(3-hexyl)thiophene (P3HT), polyaniline (PANI), polyacetylene (PA), polyazulene, polyethylene dioxythiophene (PEDOT), polyisothianapthalene (PITN), polyisothianaphthene, polythienylenevinylene, polythiophene (PT), polyparaphenylene (PPP), polyparaphenylene vinylene (PPV), polyphenylene sulfide, polyphenylene, polyfuran, polypyrrole (PPY), polyheptadiene (PHT) and the like.

The first conductive layer 210 may be formed over the entire area of the first region P1 and the entire second region P1 of the wiring 200 so as to define a substantial plane profile of the wiring 200. The second conductive layer 220 is mainly formed to be overlapped with the first conductive layer 210 in the second region P2. The first conductive layer 210 and the second conductive layer 220 may contact with each other to be electrically interconnected in the overlapped area. In FIG. 2, the second conductive layer 220 is depicted as being formed beneath the first conductive layer 210. That is, the second conductive layer 220 is formed on the base 100, and the first conductive layer 210 is overlapped on the second conductive layer 220.

The second conductive layer 220 is mainly formed in the second region P2 which is a curved portion. In this case, the second conductive layer 220 being mainly formed in the second region P2 may mean that the second conductive layer 220 is formed relatively more in the second region P2 than in the first region P1, and the area in which the first conductive layer 210 and the second conductive layer 220 are overlapped with each other is wider in the second region P2 than in the first region P1 in terms of per unit area. FIG. 2 illustrates an example in which the second conductive layer 220 has a line width same as that of the first conductive layer 210 in the second region P2 and is completely overlapped with the first conductive layer 210. Meanwhile, the second conductive layer 220 is not formed in the first region P1, and thus no overlapped area exists. However, the present invention is not limited thereto, and the second conductive layer 220 may be partially formed in the first region P1 and partially overlapped with the first conductive layer 210. Although parts of the first conductive layer 210 may be connected with each other into a line defining the plane profile of the wiring 200, parts of the second conductive layer 220 spaced apart from each other in the second regions P2 may be physically separated from each other.

As described above, the second region P2 of the wiring 200, which is a curved portion, may be stressed relatively more as the electronic device 10 repeats stretching/contraction. When the second region P2 of the wiring 200 is exposed to stress and has accumulated fatigue, the first conductive layer 210 may be partially cracked or even disconnected when severe in the second region P2 of the wiring 200, however, the second conductive layer 220 is overlapped with such a part of the first conductive layer 210 so as to thereby suppress an increase in electrical resistance. That is, even when the first conductive layer 210 is broken or disconnected, a path is provided which enables current to bypass through the second conductive layer 220 overlapped beneath the first conductive layer 210. Furthermore, because the second conductive layer 220 is formed of a material which can be relatively easily curved as compared with the material of the first conductive layer 210, the second conductive layer 220 may have a lower risk of breakage or disconnection than the first conductive layer 210 even when the wiring 200 is exposed to stress, thus preventing overall disconnection of the wiring 200 and suppressing an increase in electrical resistance.

The first region P1 of the wiring 200, which is an extension portion, may be relatively less deformed and thus, less stressed than the second region P2 even when the electronic device 10 is repeatedly subjected to stretching/contraction. It is inefficient to form, in the first region P1, which has a relatively lower risk of stress, the second conductive layer 220 to the level similar to the second conductive layer 220 in the second region P2. Furthermore, if the second conductive layer 220 is formed in the first region P1 to the level similar to that of the second conductive layer 220 in the second region P2, the thickness of the electronic device 10 may increase overall due to an increase in an average thickness of the wiring 200, and the wiring 200, which is thick overall, may prevent the electronic device 10 from being easily curved. Accordingly, the second conductive layer 220 is not formed in the second region P2 having less stress or formed relatively less in the second region P2 than in the first region P1, thus reducing an area in which the first conductive layer 210 and the second conductive layer 220 are overlapped with each other.

Other exemplary embodiments of the present invention will hereinafter be described.

Figure 5:
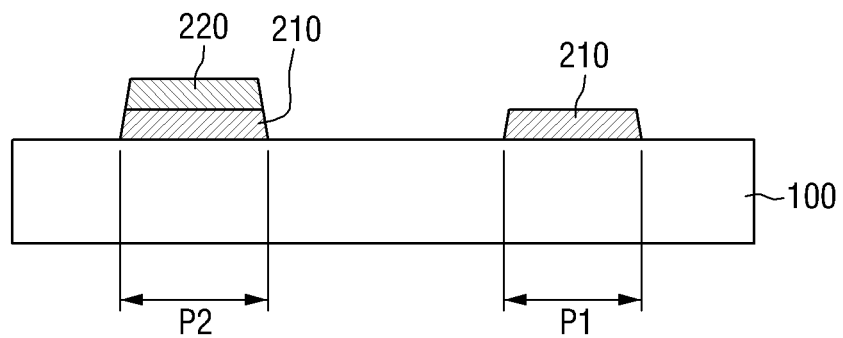
FIG. 5 is a cross-sectional view of an electronic device according to another exemplary embodiment.

FIG. 5 is a cross-sectional view of an electronic device according to another exemplary embodiment of the present invention. Referring to FIG. 5, an electronic device 11 according to another exemplary embodiment of the present invention differs from the electronic device of the exemplary embodiment described with reference to FIG. 2 in that the second conductive layer 220 is formed on the first conductive layer 210 on the base 100 rather than beneath the first conductive layer 210. The exemplary embodiment of FIG. 5 is the same as the exemplary embodiment of FIG. 2 in terms of the shape of wiring, an arrangement of the first conductive layer 210 and the second conductive layer 220 on a plane, constituting materials and the like. However, only the sequence of stacking the first conductive layer 210 and the second conductive layer 220 is changed.

The second conductive layer 220 in the exemplary embodiment of FIG. 5 is mainly formed in the second region P2 of the wiring, similarly to the second conductive layer in the exemplary embodiment of FIG. 2. Thus, even when the first conductive layer 210 is broken or disconnected in the second region P2 of the wiring, a path is provided which enables current to bypass through the second conductive layer 220 overlapped on the first conductive layer 210. Consequently, a disconnection of the wiring or an increase in electrical resistance may be prevented.

Figure 6:
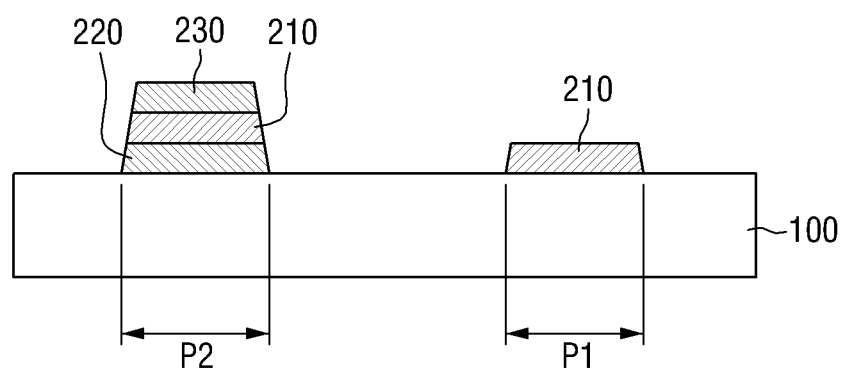
FIG. 6 is a cross-sectional view of an electronic device according to another exemplary embodiment.

FIG. 6 is a cross-sectional view of an electronic device according to another exemplary embodiment of the present invention.

Referring to FIG. 6, an electronic device 12 of this exemplary embodiment is different from the exemplary embodiment of FIG. 2 in that a third conductive layer 230 is further formed on the first conductive layer 210. The material applied to the third conductive layer 230 may be identical with the aforementioned material applied to the second conductive layer 220. The third conductive layer 230 is formed coaxially with the second conductive layer 220 on the same plane, and cooperates with the second conductive layer 220 to envelop the first conductive layer 210 from above and beneath the first conductive layer 210.

Also in this exemplary embodiment, even when the first conductive layer 210 is broken or disconnected in the second region P2 of the wiring, a path is provided which enables current to bypass through the second conductive layer 220 overlapped beneath the first conductive layer 210 and/or the third conductive layer 230 overlapped on the first conductive layer 210. Consequently, a disconnection of the wiring or an increase in electrical resistance may be prevented.

Figure 7:
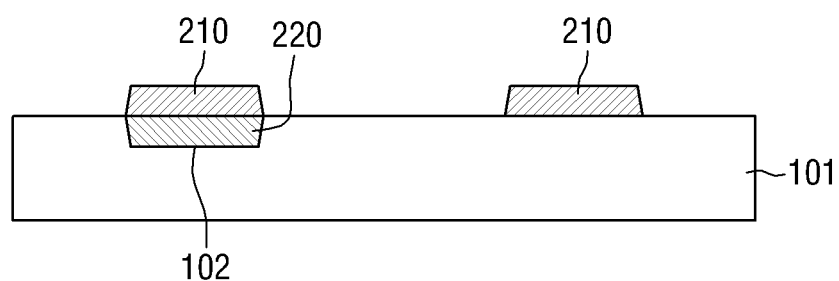
FIG. 7 is a cross-sectional view of an electronic device according to another exemplary embodiment.

FIG. 7 is a cross-sectional view of an electronic device according to another exemplary embodiment of the present invention.

Referring to FIG. 7, an electronic device 13 of another exemplary embodiment of the present invention includes a base 101 having a trench 102. The trench 102 is recessed from a surface of the base 101. The trench 102 may be arranged substantially identically to the arrangement of the second conductive layer on the plane shown in FIG. 2. The trench 102 is filled with the second conductive layer 220. The second conductive layer 220 may have a surface disposed at, but not limited to, the same level as the flat upper surface of the base 101. The first conductive layer 210 may be formed over the entire surface of the second conductive layer 220 and the flat upper surface of the base 101. The first conductive layer 210 is overlapped with the second conductive layer 220 on the trench 102.

Also in this exemplary embodiment, even when the first conductive layer 210 is broken or disconnected in the second region P2 of the wiring, a path is provided which enables current to bypass through the second conductive layer 220 overlapped on the first conductive layer 210. Consequently, a disconnection of the wiring or an increase in electrical resistance may be prevented.

Although not shown in the drawing, and contrary to the exemplary embodiment of FIG. 7, the first conductive layer 210 may be arranged beneath the second conductive layer 220, and the second conductive layer 220 may be arranged on the first conductive layer 210. For example, a trench having a plane shape same as that of the wiring may be formed in the base 101, and the trench may be filled with the first conductive layer 210. The first conductive layer 210 may have an upper surface disposed at the same level as the flat upper surface of the base 101. The second conductive layer 220 may be formed on the first conductive layer 210 in the second region P2 of the wiring.

Figure 8:
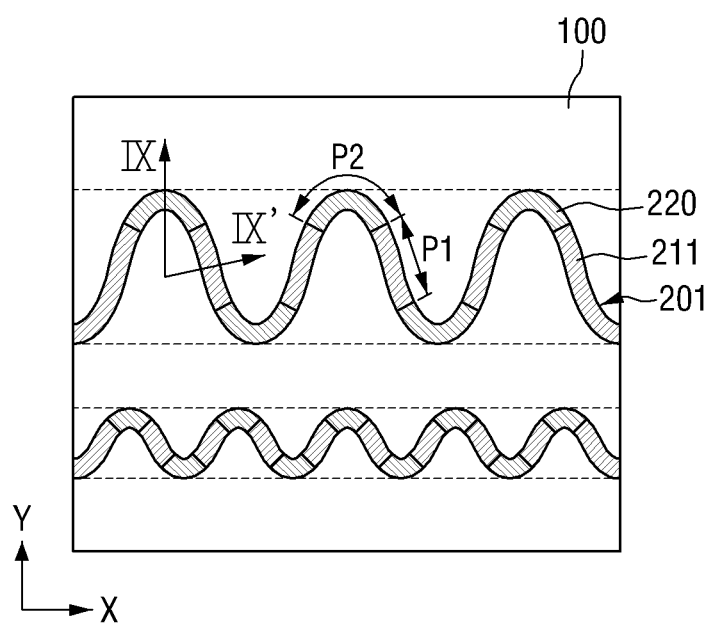
FIG. 8 is a plan view of an electronic device according to another exemplary embodiment.
Figure 9:
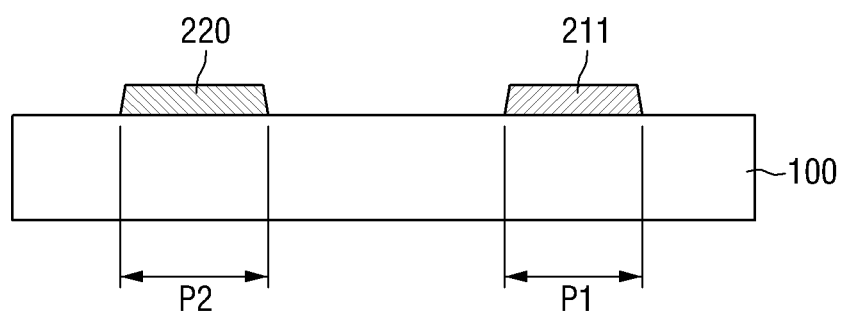
FIG. 9 is a cross-sectional view taken along the line XIII-XIII' of FIG. 8.

FIG. 8 is a plane view of an electronic device according to another exemplary embodiment of the present invention. FIG. 9 is a cross-sectional view taken along the line XIII-XIII' of FIG. 8.

Referring to FIGS. 8 and 9, an electronic device 14 according to this exemplary embodiment is identical to the embodiment of FIGS. 1 and 2 in that a wiring 201 of the electronic device 14 includes the first region P1 as an extension and the second region P2 as a curved portion. However, the electronic device 14 according to this exemplary embodiment is different from the exemplary embodiment of FIGS. 1 and 2 in that the first region P1 is formed of a first conductive layer 211 while the second region P2 is formed of the second conductive layer 220.

In detail, the first conductive layer 211 is formed in the first region P1 of the wiring 201, but is at least partially formed in the second region P2. Thus, the first conductive layer 211 is physically disconnected with the second region P2 interposed therebetween. That is, parts of the first conductive layer 211 spaced apart from each other in the first region P1 may be physically separated from each other.

The second conductive layer 220 is formed in the second region P2 of the wiring 201, but is at least partially formed in the first region P1. Thus, the second conductive layer 220 is physically disconnected with the first region P1 interposed therebetween.

The first conductive layer 211 and the second conductive layer 220 are electrically connected to each other. To this end, one side of the first conductive layer 211 and one side of the second conductive layer 220 facing each other may be partially overlapped with each other. The second conductive layer 220 may be disposed on the first conductive layer 211 on the base 100, or on the contrary, the first conductive layer 211 may be disposed on the second conductive layer 220 on the base 100 in the overlapped portion. Furthermore, the second conductive layer 220 may be provided both on and beneath the first conductive layer 211.

In addition to the case in which the first and second conductive layers 211, 220 are overlapped with each other, an alternative to electrically interconnect the first conductive layer 211 and the second conductive layer 220 may enable one end of the first conductive layer 211 and one end of the second conductive layer 220 arranged adjacently to each other to mutually contact.

Current flows alternately through the first conductive layer 211 and the second conductive layer 220 according to the above-described configuration of the wiring 201. In this exemplary embodiment, the second region P2, which is a curved portion of the wiring 201, is formed of the second conductive layer 220 having flexible characteristics, and therefore, the electronic device 14 may have a lower risk of breakage or disconnection even when the electronic device 14 is exposed to stress due to stretching/contraction of the electronic device 14. Furthermore, because the second conductive layer 220 has flexible characteristics, the maximum stretchable length of the wiring may also increase. In addition, the area in which the first conductive layer 211 and the second conductive layer 220 are overlapped with each other does not exist or is relatively small, thus reducing an average thickness of the electronic device 14 and providing advantages of easily bending the electronic device 14.

Figure 10:
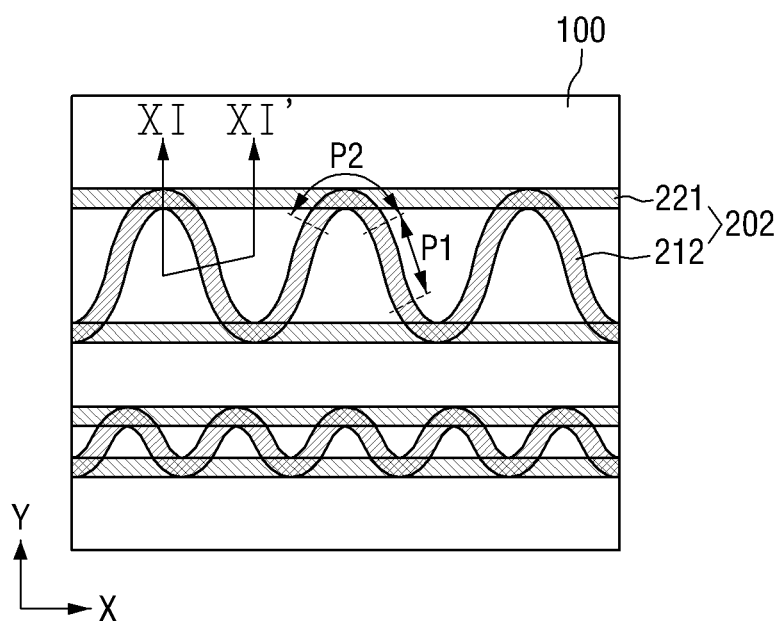
FIG. 10 is a plan view of an electronic device according to another exemplary embodiment.
Figure 11:
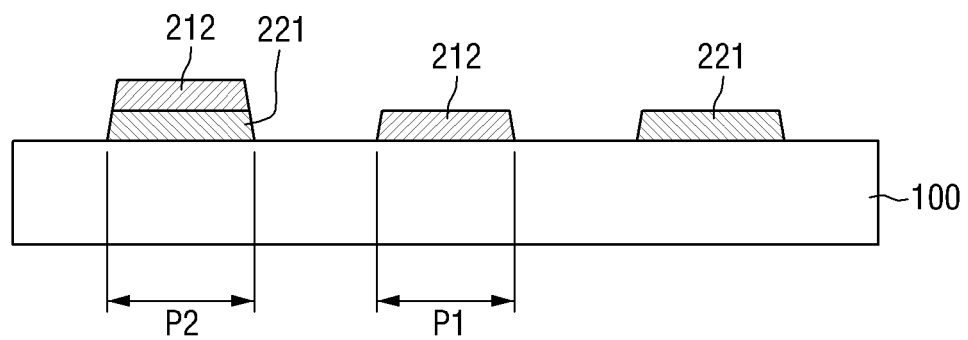
FIG. 11 is a cross-sectional view taken along the line XI-XI' of FIG. 10.

FIG. 10 is a plane view of an electronic device according to another exemplary embodiment of the present invention. FIG. 11 is a cross-sectional view taken along the line XI-XI' of FIG. 10.

Referring to FIGS. 10 and 11, an electronic device 15 according to this exemplary embodiment includes a wiring 202 having a first conductive pattern 212 and a second conductive pattern 221. The first conductive pattern 212 may be formed of a material substantially identical to the material of the first conductive layer 210 of the exemplary embodiment of FIGS. 1 and 2, and the second conductive pattern 221 may be formed of a material substantially identical to the material of the second conductive layer 220 of the exemplary embodiment of FIGS. 1 and 2.

The first conductive pattern 212 includes the first region P1, which is an extension having a shape extending generally in a proceeding direction, and the second region P2 which is a curved portion where the proceeding direction is curved.

The second conductive pattern 221 is overlapped with the first conductive pattern 212 in the second region P2 of the first conductive pattern 212. In this regard, this exemplary embodiment is the same as the exemplary embodiment of FIGS. 1 and 2. However, this exemplary embodiment is different from the exemplary embodiment of FIGS. 1 and 2 in that parts of the second conductive pattern 221 overlapped with the first conductive pattern 212 are connected with each other rather than being separated from each other.

In more detail, the second conductive pattern 221 may be formed into a line extending through the second regions P2 of the first conductive pattern 212. The line may have, for example, a straight line shape, but is not limited thereto. The drawing illustrates an example in which the second conductive pattern 221 extends in the direction parallel to X-axis. One second conductive pattern 221, which passes through the second region P2 arranged at one side of the first conductive pattern 212, and another second conductive pattern 221, which passes through the second region P2 arranged at the other side of the first conductive pattern 212, may be formed on the base 100.

The first region P1 of the first conductive pattern 212 may extend in a direction which may be inclined at a predetermined angle with respect to the extension direction X of the second conductive pattern 221. If the angle of the extension direction of the first region P1 of the first conductive pattern 212 with respect to the extension direction of the second conductive pattern 221 is defined as an intersecting tilt angle, the intersecting tilt angle of the first region P1 of the first conductive pattern 212 formed adjacently to one side of the second region P2 of the first conductive pattern 212 and the intersecting tilt angle of the first region P1 of the first conductive pattern 212 formed adjacently to the other side of the second region P2 of the first conductive pattern 212 may have signs different from each other. For example, if the intersecting tilt angle of one side of the second region P2 is a positive tilt angle, then the intersecting tilt angle of the other side of the second region P2 may be a negative tilt angle. The absolute value of the intersecting tilt angle of one side and the absolute value of the intersecting tilt angle of the other side may be the same.

The second conductive pattern 221 includes an overlapped portion which is overlapped with the first conductive pattern 212 and a non-overlapped portion which is not overlapped with the second conductive pattern 221. As described above, the overlapped portion of the second conductive pattern 221 is disposed on the second region P2 of the first conductive pattern 212, and the non-overlapped portion of the second conductive pattern 221 interconnects neighboring overlapped portions. FIG. 11 illustrates an example in which the first conductive pattern 212 is formed on the second conductive pattern 221 on the base 100 in the portion where the first conductive patterns 212 and the second conductive pattern 221 are overlapped with each other. However, the sequence of stacking the patterns may be different in other exemplary embodiments.

In this exemplary embodiment, because the second conductive pattern 221 having flexible characteristics is overlapped in the second region P2 of the first conductive pattern 212, the wiring 202 may have a lower risk of breakage or disconnection even when the wiring 202 is exposed to stress due to stretching/contraction of the electronic device 15. Furthermore, this exemplary embodiment is advantageous in that the second conductive pattern 221 has a simple shape and the first conductive pattern 212 and the second conductive pattern 221 can be aligned in a relatively easier manner.

Figure 12:
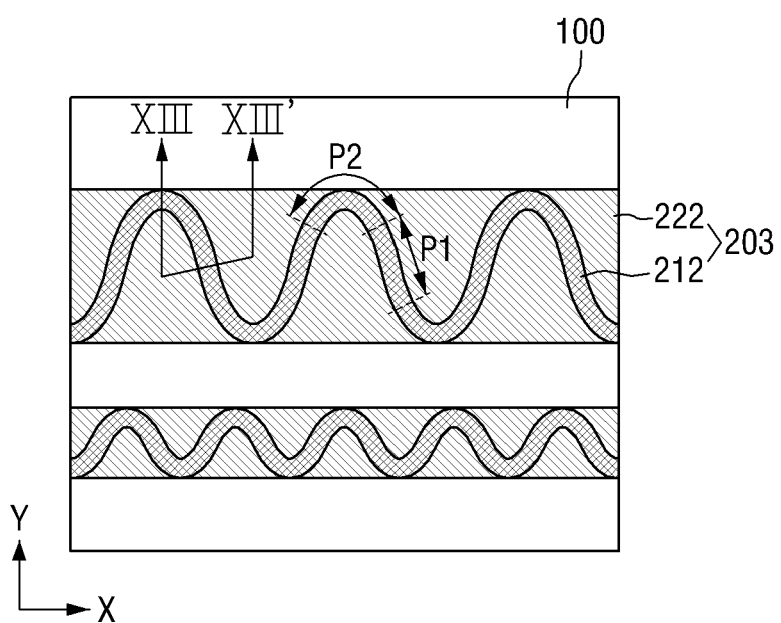
FIG. 12 is a plan view of an electronic device according to another exemplary embodiment.
Figure 13:
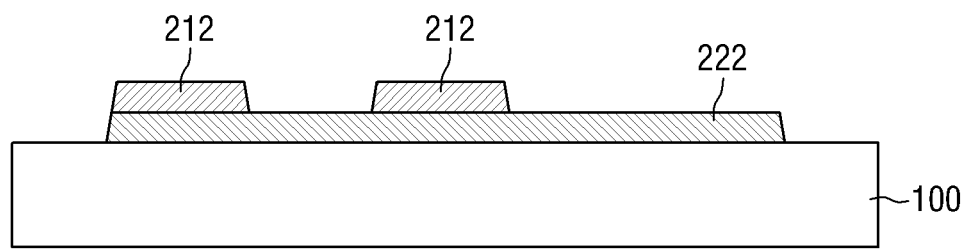
FIG. 13 is a cross-sectional view taken along the line XIII-XIII' of FIG. 12.

FIG. 12 is a plan view of an electronic device according to another exemplary embodiment of the present invention. FIG. 13 is a cross-sectional view taken along the line XIII-XIII' of FIG. 12.

Referring to FIGS. 12 and 13, an electronic device 16 according to this exemplary embodiment is identical to the electronic device of the exemplary embodiment of FIGS. 10 and 11 in that a second conductive pattern 222 of a wiring 203 is formed into a line, but the electronic device 16 according to this exemplary embodiment is different from the electronic device of the exemplary embodiment of FIGS. 10 and 11 in that one integral second conductive pattern 222 is formed to be overlapped with the whole area of the first conductive pattern 212. That is, in this exemplary embodiment, the second conductive pattern 222 is formed integrally rather than being separated to either side of the first conductive pattern 212 in Y-axis direction, to thereby cover most of the area where the first conductive pattern 212 is formed. That is, the second conductive pattern 222 is formed to be overlapped with the first region P1 as well as with the second region P2 of the first conductive pattern 212, and to also fill the space between the first regions P1.

In this exemplary embodiment, because the second conductive pattern having flexible characteristics is overlapped in the first region P1 and the second region P2 of the first conductive pattern 212, the wiring 203 may have a lower risk of breakage or disconnection even when the wiring 203 is exposed to stress resulting from stretching/contraction of the electronic device 16. Furthermore, this exemplary embodiment is advantageous in that the second conductive pattern 222 has a simple shape and the first conductive pattern 212 and the second conductive pattern 222 can be aligned in a relatively easy manner.

Figure 14:
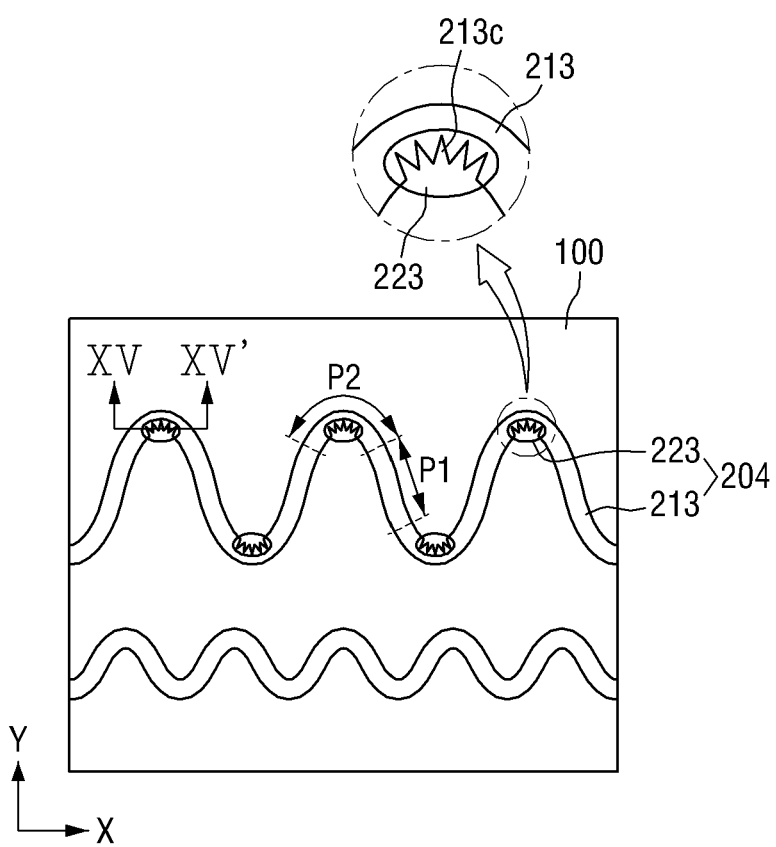
FIG. 14 is a plan view of an electronic device according to another exemplary embodiment.
Figure 15:
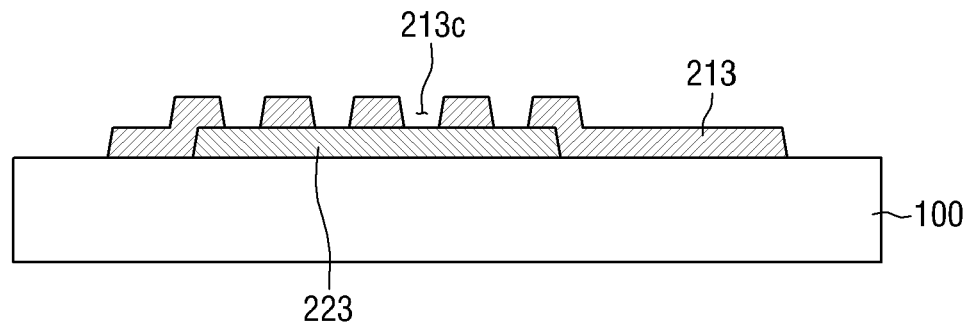
FIG. 15 is a cross-sectional view taken along the line XV-XV' of FIG. 14.

FIG. 14 is a plan view of an electronic device according to another exemplary embodiment of the present invention. FIG. 15 is a cross-sectional view taken along the line XV-XV' of FIG. 14.

Referring to FIGS. 14 and 15, an electronic device 17 according to another exemplary embodiment of the present invention includes a wiring 204 which is divided into the first region P1 as an extension and a second region P2 as a curved portion similarly to the electronic device according to the exemplary embodiment of FIGS. 1 and 2. The wiring 204 includes a first conductive layer 213 and a second conductive layer 223.

The first conductive layer 213 is formed over the entire first region P1 and the entire second region P2 of the wiring 204. The first conductive layer 213 includes a cut-out groove pattern 213c formed in the second region P2 of the wiring 204. The cut-out groove pattern 213c may have a shape cut out inwardly from a lower surface of the curved part of the second region P2. Unlike the example illustrated in the drawing, the cut-out groove pattern 213c may have a shape cut out inwardly from an upper surface of the curved part, or a shape cut out both from the lower surface and the upper surface of the curved part. A plurality of cut-out groove patterns 213c may be formed in parallel with each other in a single second region P2. The cut-out portion may have a triangular or trapezoidal shape tapered as it goes inwardly, but is not limited thereto.

The second conductive layer 223 is formed to be overlapped with the first conductive layer 213 in the second region P2 of the wiring 204. Although the second conductive layer 223 is depicted as being arranged beneath the first conductive layer 213 and overlapped with the first conductive layer 213 on the base 100 in FIG. 15, the second conductive layer 223 may be arranged on the first conductive layer 213 or both on and beneath the first conductive layer 213.

The second conductive layer 223 may be arranged to cover the cut-out groove pattern 213c of the first conductive layer 213. The second conductive layer 223 may also be formed in the cut and open part of the cut-out groove pattern 213c.

In this exemplary embodiment, the cut-out groove pattern 213c of the first conductive layer 213 may be formed in the portion of the wiring 204 which is bent or unbent during stretching/contraction, thus reducing the quantity of accumulated stress being applied to the first conductive layer 213 during stretching/contraction of the wiring 204. Furthermore, even when the first conductive layer 213 is broken or disconnected in the vicinity of the cut-out groove pattern 213c, a current bypass path may be provided because the second conductive layer 223 is overlapped with the relevant portion.

Figure 16:
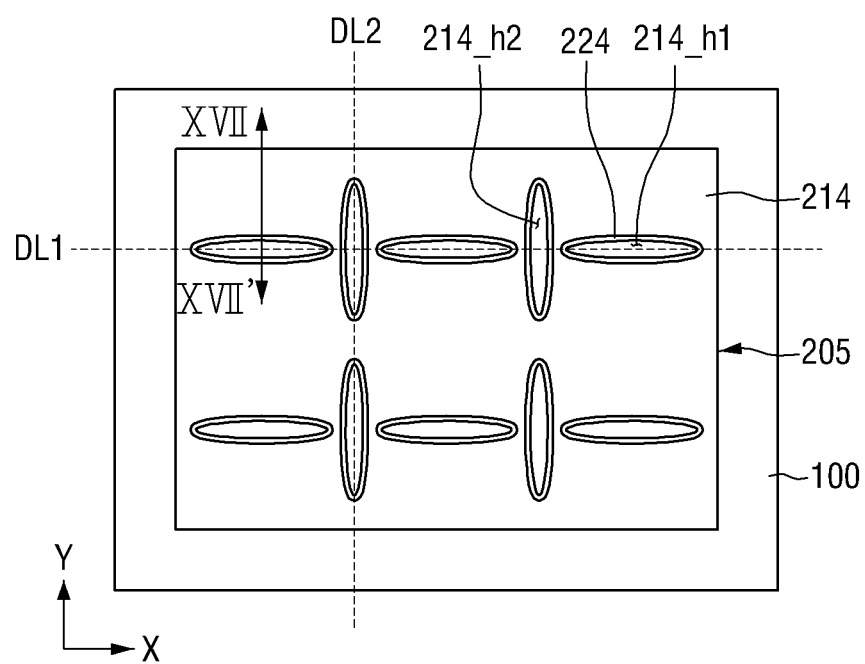
FIG. 16 is a plan view of an electronic device according to another exemplary embodiment.
Figure 17:
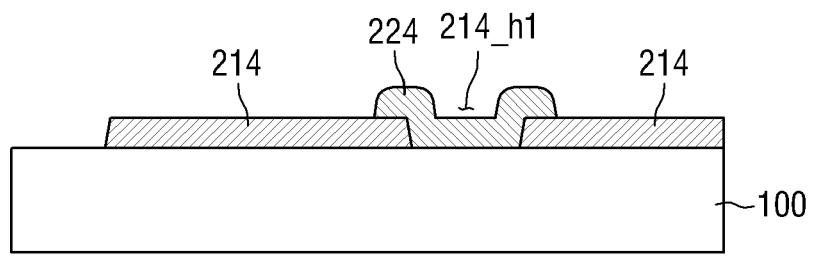
FIG. 17 is a cross-sectional view taken along the line XVII-XVII' of FIG. 16.

FIG. 16 is a plan view of an electronic device according to another exemplary embodiment of the present invention. FIG. 17 is a cross-sectional view taken along the line XVII-XVII' of FIG. 16.

The exemplary embodiment of FIGS. 16 and 17 illustrates a structure in which a wiring 205 of an electronic device 18 may keep stable resistance thereof with respect to two-dimensional stretching/contraction.

Referring to FIGS. 16 and 17, the wiring 205 of the electronic device 18 includes a first conductive layer 214 and a second conductive layer 224. The first conductive layer 214 defines an overall outer appearance of the wiring 205. The first conductive layer 214 has therein a plurality of cut-out opening patterns 214_h1 and 214_h2. The cut-out opening patterns 214_h1 and 214_h2 are shaped as a closed curve enveloped by the first conductive layer 214. The closed curve may be extended in a certain direction. For example, the closed curve may be shaped as a line segment, a rectangle with an elongated width, or an ellipse. The cut-out opening patterns may be divided into a first cut-out opening pattern 214_h1 and a second cut-out opening pattern 214_h2 based on the extending direction.

The first cut-out opening pattern 214_h1 is shaped to generally extend in a first direction (X-axis direction in the drawing). The second cut-out opening pattern 214_h2 is shaped to generally extend in a second direction (Y-axis direction in the drawing). The first direction and the second direction may be perpendicular to each other, but the present invention is not limited thereto.

A plurality of first cut-out opening patterns 214_h1 may be arranged on a first extended line DL1 extending in the first direction. The first cut-out opening patterns 214_h1 on the first extended line DL1 may be arranged with, but not limited to, constant spacing. The first extended line DL1 on which the plurality of first cut-out opening patterns 214_h1 are provided may be plural in number. In this case, the first extended lines DL1 may be parallel with each other.

A plurality of second cut-out opening patterns 214_h2 may be arranged on a second extended line DL2 extending in the second direction. The second cut-out opening patterns 214_h2 on the second extended line DL2 may be arranged with, but not limited to, constant spacing. The second extended line DL2 on which the plurality of second cut-out opening patterns 214_h2 are provided may be plural in number. In this case, the second extended lines DL2 may be parallel with each other.

The second cut-out opening pattern 214_h2 may be arranged across the gap between two adjacent first cut-out opening patterns 214_h1 on the first extended line DL1. Similarly, the first cut-out opening pattern 214_h1 may be arranged across the gap between two adjacent second cut-out opening patterns 214_h2 on the second extended line DL2.

The width of the first cut-out opening pattern 214_h1 is stretched when the electronic device 18 is stretched in the direction (Y-axis direction in the drawing) perpendicular to the first direction, so as to thereby enable the first conductive layer 214 to be stretched accordingly. The width of the second cut-out opening pattern 214_h2 is stretched when the electronic device 18 is stretched in the direction (X-axis direction in the drawing) perpendicular to the second direction, so as to thereby enable the first conductive layer 214 to be stretched accordingly.

The second conductive layer 224 is arranged in the area where the first cut-out opening pattern 214_h1 and the second cut-out opening pattern 214_h2 are formed, and is electrically connected to the first conductive layer 214. The second conductive layer 224 may be arranged on and/or beneath the first conductive layer 214 on the base 100. The second conductive layer 224 is arranged in the area where the first cut-out opening pattern 214_h1 and the second cut-out opening pattern 214_h2 are formed, so as to compensate for an excessive increase in the resistance of the wiring caused due to an excessive increase in the width of the first cut-out opening pattern 214_h1 or the second cut-out opening pattern 214_h2 when the electronic device 18 is stretched in the direction perpendicular to the first or second direction. As discussed above, the second conductive layer 224 is made of a relatively flexible material, and therefore, the second conductive layer 224 may be easily stretched and serve to relieve accumulated stress concentrated to the cut-out opening patterns 214_h1 and 214_h2.

The second conductive layer 224 may be formed to completely fill the cut-out opening patterns 214_h1 and 214_h2, and a part of the second conductive layer 224 may be overlapped with the first conductive layer 214 in the vicinity of the cut-out opening patterns 214_h1 and 214_h2. The second conductive layer 224 formed in neighboring opening patterns 214_h1 and 214_h2 may be disconnected from or connected with each other. In this case, the second conductive layer 224 may have a lattice shape.

The electronic devices according to exemplary embodiments of the present invention are configured to use flexible conductive materials having relatively lower risk of breakage or disconnection that are formed in the portions which are relatively highly stressed by repeated stretching/contraction. Therefore, disconnections of wirings can be prevented and an increase in electrical resistance can be suppressed even when the wirings are subjected to repeated stretching/contraction.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An electronic device comprising:
   a stretchable/contractible base; and
   a wiring formed on the base, the wiring being divided into
      a first region having a shape extending in a proceeding direction and a second region in which the proceeding direction is curved,
   wherein:
   the wiring comprises a first conductive layer and a second conductive layer formed of a material that makes the second conductive layer easier to be curved than the first conductive layer;
   the first conductive layer is formed in the first region and the second region, and the second conductive layer is formed in the second region; and
   the first conductive layer is overlapped with the second conductive layer in a portion of the second region that extends along a curved path prior to stretching.

2. The electronic device of claim 1, wherein the first conductive layer is formed over the entire first region and the entire second region.

3. The electronic device of claim 1, wherein an area in which the first conductive layer and the second conductive layer are overlapped with each other is wider in the second region than in the first region in terms of per unit area.

4. The electronic device of claim 1, wherein parts of the second conductive layer that are formed in parts of the second region spaced apart from each other, are physically separated from each other.

5. The electronic device of claim 1, wherein the first conductive layer comprises a cut-out groove pattern provided in the second region.

6. The electronic device of claim 1, wherein parts of the first conductive layer that are formed in parts of the first region spaced apart from each other, are physically separated from each other.

7. The electronic device of claim 6, wherein the first conductive layer and the second conductive layer are electrically connected to each other.

8. The electronic device of claim 1, wherein the second region is arranged on the base with a shape having a regular cycle.

9. The electronic device of claim 1, wherein the first conductive layer is made of a rigid conductive material and the second conductive layer is made of a flexible conductive material.

10. The electronic device of claim 9, wherein the first conductive layer is formed of metal or a metal oxide layer, and the second conductive layer is formed of carbon nanotube, graphene, metal nanowire, metal nanoparticle, metal ribbon, conductive polymer, or a mixture thereof.

11. An electronic device comprising:
a stretchable/contractible base; and
a wiring formed on the base, the wiring comprising a first conductive pattern and a second conductive pattern formed of a material that makes the second conductive pattern easier to be curved than the first conductive pattern,
wherein:
the first conductive pattern is divided into a first region having a shape extending in a proceeding direction and a second region in which the proceeding direction is curved;
the second conductive pattern is formed into a line extending through the second region of the first conductive pattern; and
the second conductive pattern is overlapped with the first conductive pattern in a portion of the second region that extends along a curved path prior to stretching.

12. The electronic device of claim 11, wherein the second conductive pattern comprises:
one second conductive pattern which passes through the second region arranged at one side of the first conductive pattern; and
another second conductive pattern which passes through the second region arranged at the other side of the first conductive pattern.

13. The electronic device unit of claim 11, wherein the first conductive pattern is made of a rigid conductive material and the second conductive pattern is made of a flexible conductive material.

14. The electronic device of claim 13, wherein the first conductive pattern is formed of metal or a metal oxide layer, and the second conductive pattern is formed of carbon nanotube, graphene, metal nanowire, metal nanoparticle, metal ribbon, conductive polymer, or a mixture thereof.

15. An electronic device comprising:
a stretchable/contractible base;
a first conductive layer formed on the base, the first conductive layer comprising therein a first cut-out opening pattern extendable in a first direction and a second cut-out opening pattern extendable in a second direction, the first cut-out opening pattern and the second cut-out opening pattern exposing portions of an upper surface of the base below the first conductive layer; and
a second conductive layer formed in the first cut-out opening pattern and the second cut-out opening pattern on the exposed portions of the upper surface of the base below the first conductive layer, and electrically connected to the first conductive layer,
wherein the second conductive layer is formed of a material that makes the second conductive layer easier to be curved than the first conductive layer.

16. The electronic device unit of claim 15, wherein the first conductive layer is made of a rigid conductive material and the second conductive layer is made of a flexible conductive material.

17. The electronic device of claim 16, wherein the first conductive layer is formed of metal or a metal oxide layer, and the second conductive layer is formed of carbon nanotube, graphene, metal nanowire, metal nanoparticle, metal ribbon, conductive polymer, or a mixture thereof.

* * * * *